United States Patent
Baek et al.

(10) Patent No.: US 8,824,184 B2
(45) Date of Patent: Sep. 2, 2014

(54) SEMICONDUCTOR MEMORY DEVICES

(75) Inventors: Ingyu Baek, Seoul (KR); Chanjin Park, Yongin-si (KR); Hyunsu Ju, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 93 days.

(21) Appl. No.: 13/587,476

(22) Filed: Aug. 16, 2012

(65) Prior Publication Data

US 2013/0044531 A1 Feb. 21, 2013

(30) Foreign Application Priority Data

Aug. 17, 2011 (KR) .................. 10-2011-0081736

(51) Int. Cl.
*G11C 5/02* (2006.01)
*G11C 8/14* (2006.01)
*G11C 7/18* (2006.01)
*G11C 5/06* (2006.01)

(52) U.S. Cl.
CPC ..... *G11C 5/025* (2013.01); *G11C 8/14* (2013.01); *G11C 7/18* (2013.01); *G11C 5/063* (2013.01)
USPC ............................ 365/51; 365/63; 365/185.06

(58) Field of Classification Search
CPC .......... G11C 5/025; G11C 5/063; G11C 7/18; G11C 8/14; G11C 8/08; G11C 5/02
USPC ......... 365/51, 63, 72, 185.05, 185.06, 230.06
See application file for complete search history.

(56) References Cited

U.S. PATENT DOCUMENTS

| | | | |
|---|---|---|---|
| 7,885,114 B2 * | 2/2011 | Park et al. ................ | 365/185.17 |
| 7,910,914 B2 | 3/2011 | Tanaka et al. | |
| 7,952,163 B2 | 5/2011 | Baek et al. | |
| 8,395,190 B2 * | 3/2013 | Shim et al. ................. | 257/208 |
| 8,547,747 B2 * | 10/2013 | Kim et al. ................. | 365/185.18 |
| 8,547,766 B2 * | 10/2013 | Won et al. ................. | 365/214 |
| 2008/0175032 A1 | 7/2008 | Tanaka et al. | |
| 2009/0154240 A1 * | 6/2009 | Park et al. ................. | 365/185.05 |
| 2010/0254191 A1 * | 10/2010 | Son et al. ................. | 365/185.05 |
| 2010/0327323 A1 | 12/2010 | Choi | |
| 2011/0244666 A1 * | 10/2011 | Kim et al. ................. | 438/478 |

FOREIGN PATENT DOCUMENTS

| | | |
|---|---|---|
| KR | 20090098189 A | 9/2009 |
| KR | 1028993 B1 | 1/2011 |
| KR | 1027349 B1 | 2/2011 |
| KR | 20110015337 A | 2/2011 |

* cited by examiner

*Primary Examiner* — Gene Auduong

(74) *Attorney, Agent, or Firm* — Harness, Dickey & Pierce, P.L.C.

(57) ABSTRACT

A semiconductor memory device includes a stacked structure including a plurality of wordline structures sequentially stacked that each include: a plurality of wordlines with sidewalls and extending in a first direction on the substrate, and a connecting pad extending in a second direction on the substrate and being connected in common to the plurality of wordlines. A plurality of interconnections at a height over the substrate are connected to the connecting pads of the wordline structures, respectively. The device further includes bitlines substantially vertical to a top surface of the substrate and crossing one of the sidewalls of the plurality of wordlines, and memory elements between the bitlines and the plurality of wordlines, respectively. A length of the connecting pad in the second direction is substantially equal to a product of a minimum pitch between the interconnections and a stack number of one of the plurality of wordlines.

20 Claims, 12 Drawing Sheets

SEMICONDUCTOR MEMORY DEVICES

CROSS-REFERENCE TO RELATED APPLICATIONS

This U.S. non-provisional patent application claims priority under 35 U.S.C. §119 to Korean Patent Application No. 10-2011-0081736, filed on Aug. 17, 2011, the entire disclosure of which is incorporated by reference herein.

BACKGROUND

Example embodiments of inventive concepts relate to semiconductor devices and, more particularly, to semiconductor memory devices including three-dimensionally arranged memory cells.

Generally, semiconductor memory devices may store digital data. Demand for high integration of the semiconductor memory devices has been increased with the development of electronic industries and semiconductor industries. For example, the semiconductor memory devices have been required to store larger amounts of data with the development of electronic devices such as laptop computers, cellular phones, digital cameras, or MP3 players, For high integration of semiconductor memory devices, a minimum line width of fine patterns constituting devices may be reduced. Since the minimum line width of the fine patterns is two-dimensionally reduced, it is possible to integrate many memory cells in a limited area. However, there is a limit to methods of reducing the minimum line width due to various factors (for example, limit of photolithography process, etc). For this reason, various researches have been conducted for higher integration of semiconductor memory devices.

SUMMARY

Example embodiments of inventive concepts may provide three-dimensional semiconductor memory devices capable of improving integration and reliability.

According to example embodiments, a semiconductor memory device includes a substrate including a cell array region between first and second connection regions; a first stacked structure including a plurality of first wordline structures sequentially stacked, each of the first wordline structures including a plurality first wordlines extending in a first direction on the cell array region of the substrate, and a first connecting pad extending in a second direction crossing the first direction on the first connection region of the substrate and being connected in common to at least one of the plurality of first wordlines; and first interconnections at the same height from the first connection region of the substrate, the first interconnections being connected to the first connecting pad of the plurality of first wordline structures, respectively. A length of the first connecting pad in the second direction may be substantially equal to a product of a minimum pitch between the first interconnections and a stack number of one of the plurality first wordline structures.

According to example embodiments, a semiconductor memory device includes a substrate including a cell array region adjacent to a connection region; a stacked structure including a plurality of wordline structures sequentially stacked, each of the wordline structures including a plurality of wordlines extending in a first direction on the cell array region of the substrate, the plurality of wordlines including sidewalls, and a connecting pad extending in a second direction crossing the first direction on the connection region of the substrate and being connected in common to the wordlines; a plurality of interconnections at a same height from the connection region of the substrate, the interconnections connected to the connecting pads of the wordline structures, respectively; bitlines substantially vertical to a top surface of the substrate and crossing one of the sidewalls of the wordlines; and memory elements between the bitlines and the wordlines, respectively. A length of the connecting pad in the second direction may be substantially equal to a product of a minimum pitch between the interconnections and a stack number of one the plurality of wordline structures.

According to example embodiments, a semiconductor device includes a first plurality of local bitlines extending vertically over a cell array region of the substrate; a plurality of first interconnection lines spaced apart by a first pitch and extending in a first direction on a first connection region of the substrate; a first local wordline structure including a plurality of first wordlines spaced apart vertically and extending in the first direction over the cell array region of the substrate, the plurality of first wordlines including first pad portions that are connected to the plurality of first interconnection lines and extend in a second direction over the first connection region of the substrate, the second direction intersecting the first direction, and a length of one of the first pad portions extending in the second direction equals a product of the first pitch of the plurality of the first interconnection lines and a stack number of the one of the first pad portions of the plurality of first wordlines.

A first resistive memory pattern may be between the first plurality of local bitlines and the plurality of first local wordlines of the first local wordline structure.

The device may further include a second plurality of local bitlines extending vertically over the cell array region of the substrate; a plurality of second interconnection lines spaced apart by a second pitch and extending in a first direction on a second connection region of the substrate; a second local wordline structure including a plurality of second wordlines spaced apart vertically and extending in the first direction over the cell array region of the substrate, the plurality of second wordlines including second pad portions that are connected to the plurality of second interconnection lines and extend in a second direction over the second connection region of the substrate, and a length of one of the second pad portions extending in the second direction may be equal to a product of the second pitch of the plurality of the second interconnection lines and a stack number of the one of the second pad portions of the plurality of second wordlines.

BRIEF DESCRIPTION OF THE DRAWINGS

The foregoing and other features and advantages of inventive concepts will become more apparent from the more particular description of non-limiting embodiments of inventive concepts, as illustrated in the accompanying drawings in which like reference characters refer to the same parts through the different views. The drawings are not necessarily to scale, emphasis instead being placed upon illustrating the principles of inventive concepts. In the drawings.

DETAILED DESCRIPTION

Figure 1:
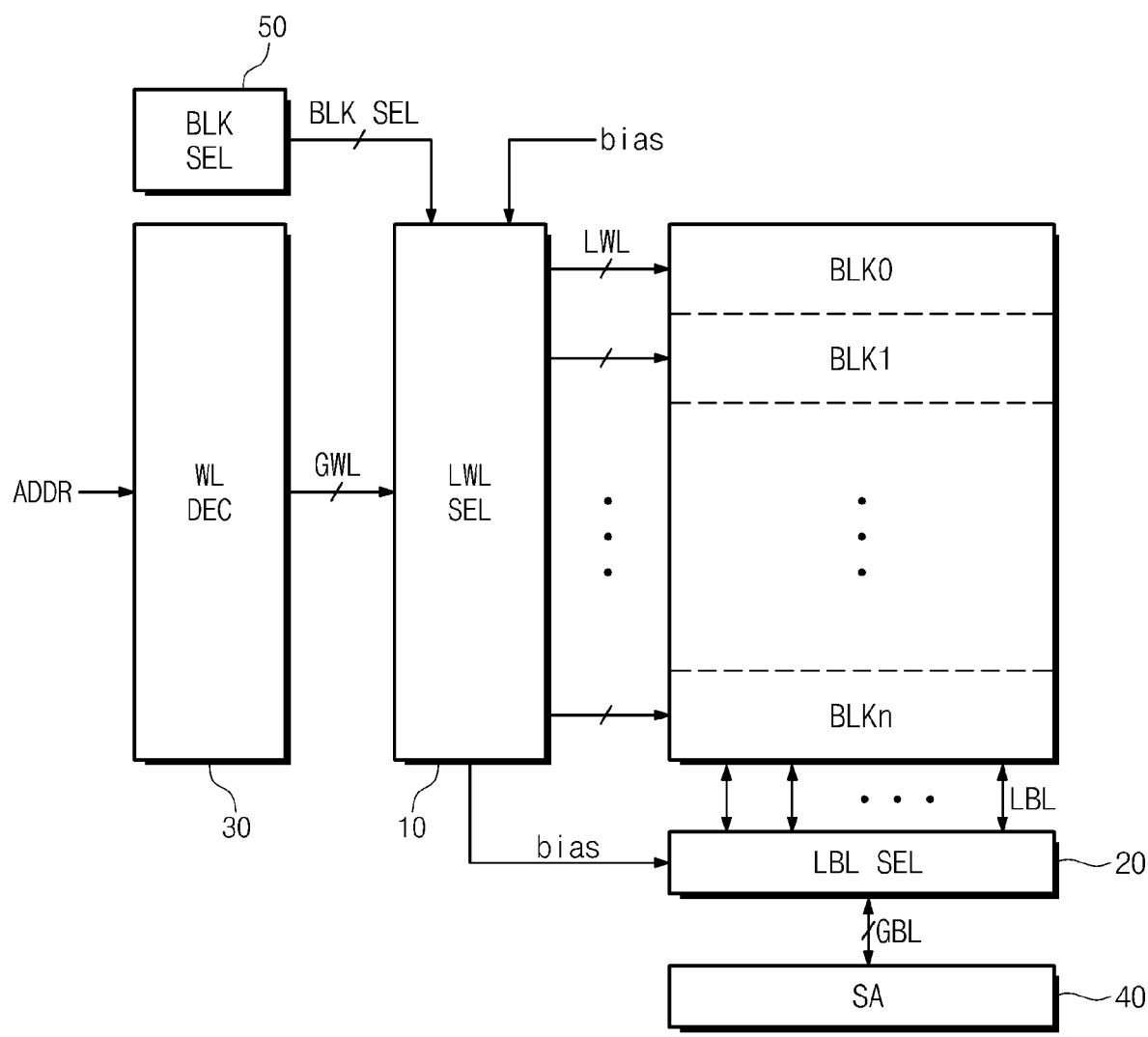
FIG. 1 is a schematic block diagram illustrating a semiconductor memory device according to example embodiments of inventive concepts.

Example embodiments of inventive concepts will now be described more fully hereinafter with reference to the accompanying drawings, in which some example embodiments of inventive concepts are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

The terminology used herein is for the purpose of describing particular embodiments only and is not intended to limit the scope of example embodiments of inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element could be termed a second element in example embodiments of inventive concepts without departing from the teachings of example embodiments of inventive concepts.

Moreover, example embodiments of inventive concepts are described herein with reference to cross-sectional illustrations and/or plane illustrations that are idealized illustrations. Accordingly, variations from the shapes of the illustrations as a result, for example, of manufacturing techniques and/or tolerances, are to be expected. Thus, example embodiments of inventive concepts should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a semiconductor memory device according to example embodiments of inventive concepts.

Referring to FIG. 1, a semiconductor memory device according to example embodiments of inventive concepts may include a plurality of memory blocks BLK0 to BLKn, a local wordline selection unit 10, a local bitline selection unit 20, a wordline decoder 30, a sense amplifier 40, and a block selection circuit 50.

Each of the memory blocks BLK0 to BLKn may include a plurality of local wordlines LWL, a plurality of local bitlines LBL, and a plurality of memory cells. Each of the memory blocks BLK0 to BLKn may be connected to the local wordline selection unit 10 and the local bitline selection unit 20.

The local wordline selection unit 10 may connect the local wordlines LWL of a selected memory block to global wordlines GWL provided from the wordline decoder 30 according to a block selection signal BLK SEL. The local wordline selection unit 10 may provide the local bitline selection unit 20 with a bias signal for driving the bitline selection unit 20 connected to the selected memory block.

The local bitline selection unit 20 may connect the local bitlines LBL of the selected memory block to global bitlines GBL provided from the sense amplifier 40 according to the bias signal.

The memory blocks BLK0 to BLKn connected to the local wordline selection unit 10 may share the word line decoder 30 and the memory blocks BLK0 to BLKn connected to the local bitline selection unit 20 may share the sense amplifier 40.

The word line decoder 30 may decode an address ADDR inputted from the outside to select one of the global wordlines GWL. The number of the global wordlines GWL may be equal to the number of the local wordlines LWL of each of memory blocks BLK0 to BLKn. The word line decoder 30 may be connected in common to the plurality of memory blocks of BLK0 to BLKn. The word line decoder 30 may provide data information to the local wordlines LWL of the selected memory block according to the block selection signal BLK SEL of the block selection circuit 50. Thus, the local wordlines LWL of each of the memory blocks BLK0 to BLKn may be selected by the same address information.

The sense amplifier 40 may sense data stored in the memory cells during a read operation. According to an operation mode, the sense amplifier 40 may temporarily store data which will be stored in the memory cells. The sense amplifier 40 may be connected in common to the plurality of memory blocks BLK0 to BLKn. The sense amplifier 40 may sense data stored in the memory cells of the selected memory block by the block selection circuit 50.

Additionally, the sense amplifier 40 may be connected to a bitline decoder (not shown). The bitline decoder (not shown) may select the global bitline GBL connected to a selected memory cell according to the address information. The bitline decoder may provide a transmission path between the sense amplifier 40 and an external device (e.g., a memory controller, a memory control circuit, a microprocessor).

The block selection circuit 50 may generate the block selection signal BLK SEL for selecting one of the memory blocks BLK0 to BLKn according to the address information. The local wordlines LWL and the local bitlines LBL of the memory block selected by the block selection signal BLK SEL may be correspondingly connected to the global wordlines GWL and the global bitlines GBL, respectively.

Figure 2:
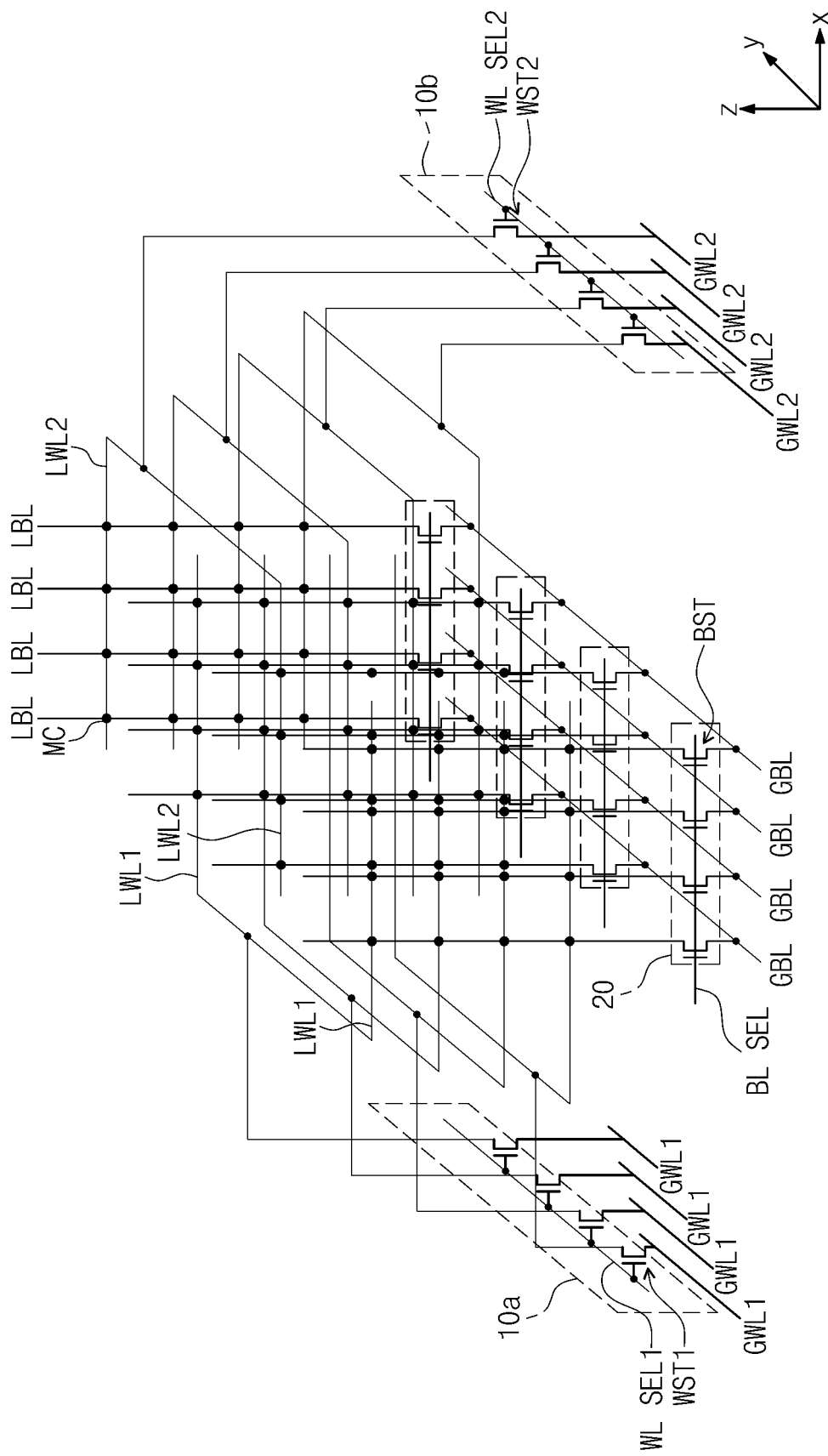
FIG. 2 is a circuit diagram illustrating a semiconductor memory device according to example embodiments of inventive concepts.

FIG. 2 is a circuit diagram illustrating a semiconductor memory device according to example embodiments of inventive concepts.

Referring to FIG. 2, each of the memory blocks (BLK0 to BLKn of FIG. 1) of the semiconductor memory device according to example embodiments of inventive concepts may include three-dimensionally arranged memory cells MC. The semiconductor memory device may be configured to reduce (and/or minimize) a leakage current through non-selected memory cells MC.

Each of the memory blocks (BLK0 to BLKn of FIG. 1) may include a plurality of local bitlines LBL extending side by side in a z-axis direction and a plurality of first local wordlines LWL1 extending side by side in an x-axis direction perpendicular to the z-axis direction. The z-axis direction may be a direction perpendicular to a xy plane. Additionally, each of the memory blocks (BLK0 to BLKn of FIG. 1) may further include second local wordlines LWL2 which are disposed between the first local wordlines LWL1 and extends in parallel to the first local wordlines LWL1

The first local word lines LWL1 in each of the memory blocks (BLK0 to BLKn of FIG. 1) may be stacked in the z-axis direction to be spaced apart from each other. The second local word lines LWL2 in each of the memory blocks (BLK0 to BLKn of FIG. 1) may also be stacked in the z-axis direction to be spaced apart from each other.

According to example embodiments, the first local wordlines LWL1 disposed at the same height in each of the memory blocks (BLK0 to BLKn of FIG. 1) may be electrically connected to each other. The second local wordline LWL2 disposed at the same height in each of the memory blocks (BLK0 to BLKn of FIG. 1) may be electrically connected to each other. The second local wordlines LWL2 may be electrically insulated from the first local wordlines LWL1 horizontally adjacent thereto.

The first and second local wordlines LWL1 and LWL2 may cross the local bitlines LBL. The memory cells MC may be disposed at cross points of the local bitlines LBL and the wordlines LWL1 and LWL2, respectively. Thus, the memory cells MC may be three-dimensionally arranged in the memory blocks (BLK0 to BLKn of FIG. 1).

According to example embodiments of inventive concepts, each of the memory cells MC may have a resistive memory element. In other words, the memory cells MC may constitute a cross point memory array without selection components for accessing the resistive memory elements. Alternatively, each of the memory cells MC may include a resistive memory element and a selection component. Here, the resistive memory element may be connected between the local bitline LBL and the selection component, and the selection component may be connected to the resistive memory element and one of the first and second wordlines LWL1 and LWL2.

The resistive memory element may include a material configured to reversibly switch between at least two resistive states clearly distinguished from each other by voltages applied to both ends thereof. For example, the resistive memory element may include perovskite compounds, transition metal oxides, phase-change materials, magnetic materials, ferromagnetic materials, or antiferromagnetic materials.

The selection component may control a current supply of the resistive memory element. According to example embodiments, the selection component may be a PN or PIN junction diode. Alternatively, the selection component may be a field effect transistor (FET).

According to example embodiments, the memory blocks (BLK0 to BLKn of FIG. 1) may share the global bitlines GBL. The global bitlines GBL may be connected to the sense amplifier (40 of FIG. 1).

The local bitline LBL of each of the memory blocks (BLK0 to BLKn of FIG. 1) may be coupled to the global bitlines GBL, respectively. The global bitlines GBL may extend side by side in a y-axis direction. The y-axis direction is perpendicular to the z-axis and x-axis directions.

The local bitline selection unit 20 may be disposed between the local bitlines LBL and the global bitlines GBL. In more detail, the local bitline selection unit 20 may include a plurality of bitline selection transistors BST. Each of the bitline selection transistors BST includes a gate electrode and source/drain electrodes. The source/drain electrodes of the bitline selection transistor BST may be connected to the local bitline LBL and the global bitline GBL, respectively. The gate electrodes of the bitline selection transistors BST may be connected in common to a bitline selection line BL SEL.

The plurality of the memory blocks (BLK0 to BLKn of FIG. 1) may share first and second global wordlines GWL1 and GWL2. The first and second global wordlines GWL1 and GWL2 may be connected to the wordline decoder (30 of FIG. 1).

In each of the memory blocks (BLK0 to BLKn of FIG. 1), the first local wordlines LWL1 may be coupled to the first global wordlines GWL1, and the second local wordlines may be coupled to the second global wordlines GWL2. The first and second global wordlines GWL1 and GWL2 may extend side by side in the y-axis direction. For example, the first and second global wordlines GWL1 and GWL2 may extend in parallel to the global bitlines GBL.

According to example embodiments of inventive concepts, each of in each of the memory blocks (BLK0 to BLKn of FIG. 1) may include a first local wordline selection unit 10a and a second local wordline selection unit 10b.

The first local wordline selection unit 10a may be disposed between the first local wordlines LWL1 and the first global wordlines GWL1. The second local wordline selection unit 10b may be disposed between the second local wordlines LWL2 and the second global wordlines GWL2. The first local wordline selection unit 10a may include first wordline selection transistors WST1 respectively corresponding to the first local wordlines LWL1. The first local wordline selection unit 10a may connect the first local wordlines LWL1 to the first global wordlines GWL1. The second local wordline selection unit 10b may include second wordline selection transistors WST2 respectively corresponding to the second local wordlines LWL2. The second local wordline selection unit 10b may connect the second local wordlines LWL2 to the second global wordlines GWL2. Gate electrodes of the first wordline selection transistors WST1 may be connected in common to a first wordline selection line WL SEL1 Gate electrodes of the second selection wordlines WST2 may be connected in common to a second wordline selection line WL SEL2.

A method of selecting one memory cell MC in the semiconductor memory device described above will be explained.

Referring to FIGS. 1 and 2, one of the memory blocks BLK0 to BLKn may be selected by the block selection signal BLK SEL provided from the block selection circuit 50.

The first and second wordline selection transistors WST1 and WST2 of the selected memory block may be turned on by the block selection signal BLK SEL, so that the first local wordlines LWL1 of the selected memory block may be connected to the first global wordlines GWL1, respectively, and the second local wordlines LWL2 of the selected memory block may be connected to the second global wordlines GWL2. Additionally, the bitline selection transistors BST of the selected memory block may be turned on by the block selection signal BLK SEL, so that the local bitlines LBL of the selected memory block may be connected to the global bitlines GBL, respectively.

Moreover, operation voltages may be applied to one global wordline GWL1 or GWL2 selected from the first and second global wordlines GWL1 and GWL2, and one global bitline GBL selected from the global bitlines GBL, thereby selecting one memory cell MC in each of the selected memory block. A power supply (e.g., circuit including a capacitor) may be configured to apply the operation voltages to one global wordline GWL1 or GWL2 and one of the global bitlines GBL.

Figure 3:
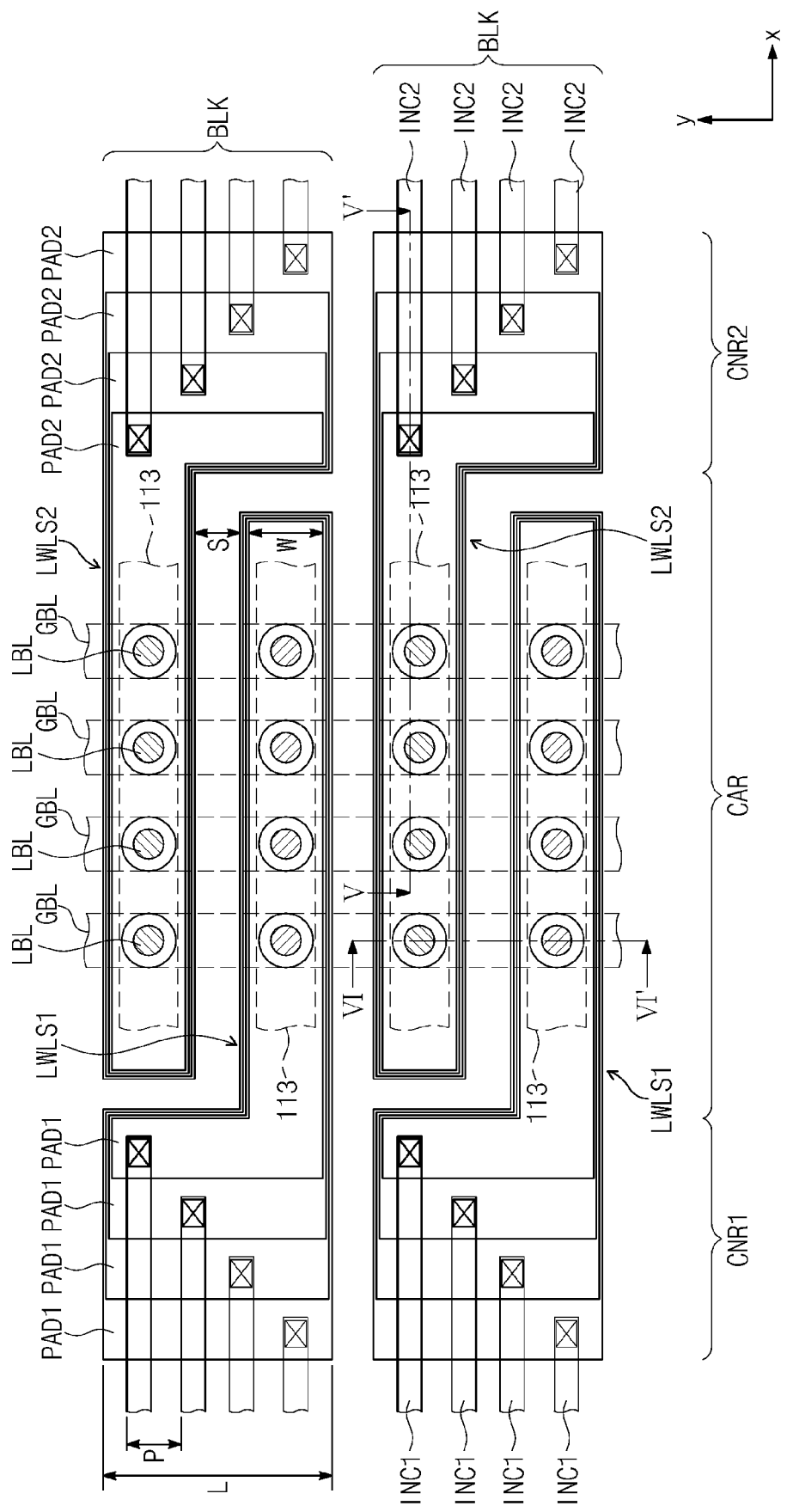
FIG. 3 is a plan view illustrating a semiconductor memory device according to example embodiments of inventive concepts.
Figure 4:
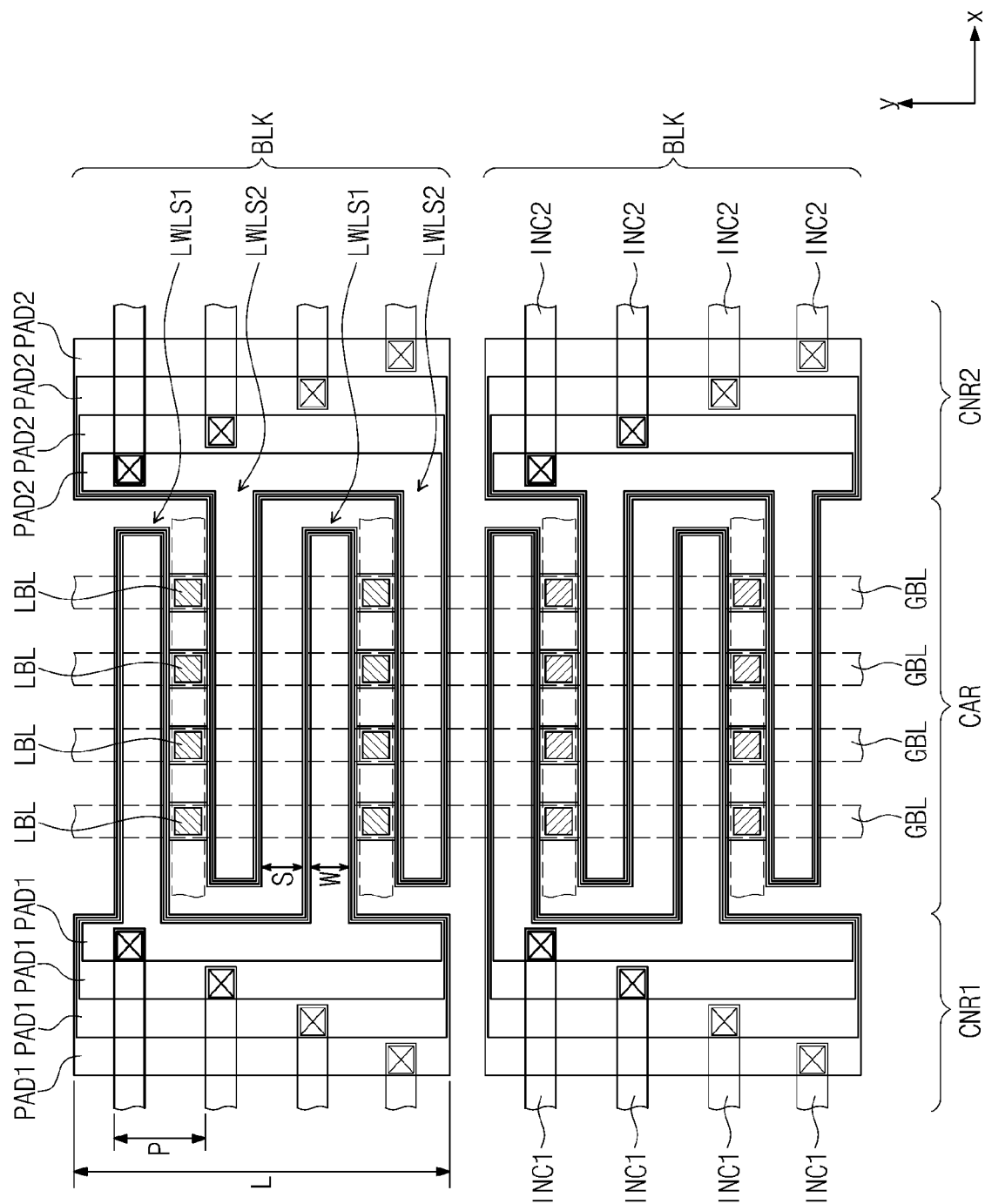
FIG. 4 is a plan view illustrating a semiconductor memory device according to example embodiments of inventive concepts.

FIG. 3 is a plan view illustrating a semiconductor memory device according to example embodiments of inventive concepts. FIG. 4 is a plan view illustrating a semiconductor memory device according to example embodiments of inventive concepts.

Figure 5A:
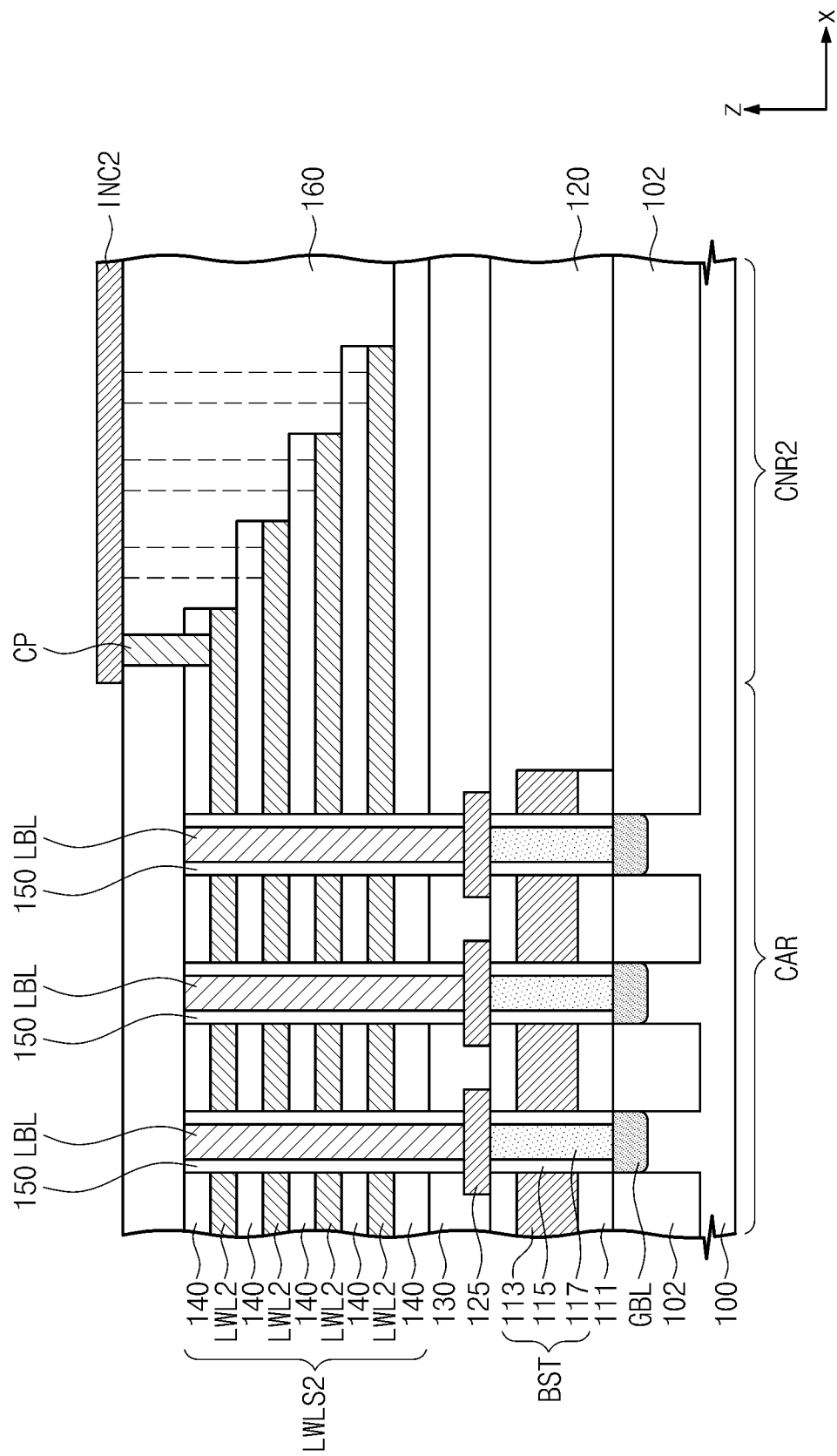
FIGS. 5A and 6A are cross-sectional views respectively taken along lines V-V' and VI-VI' of FIG. 3 to explain a semiconductor device according to example embodiments of inventive concepts.
Figure 6A:
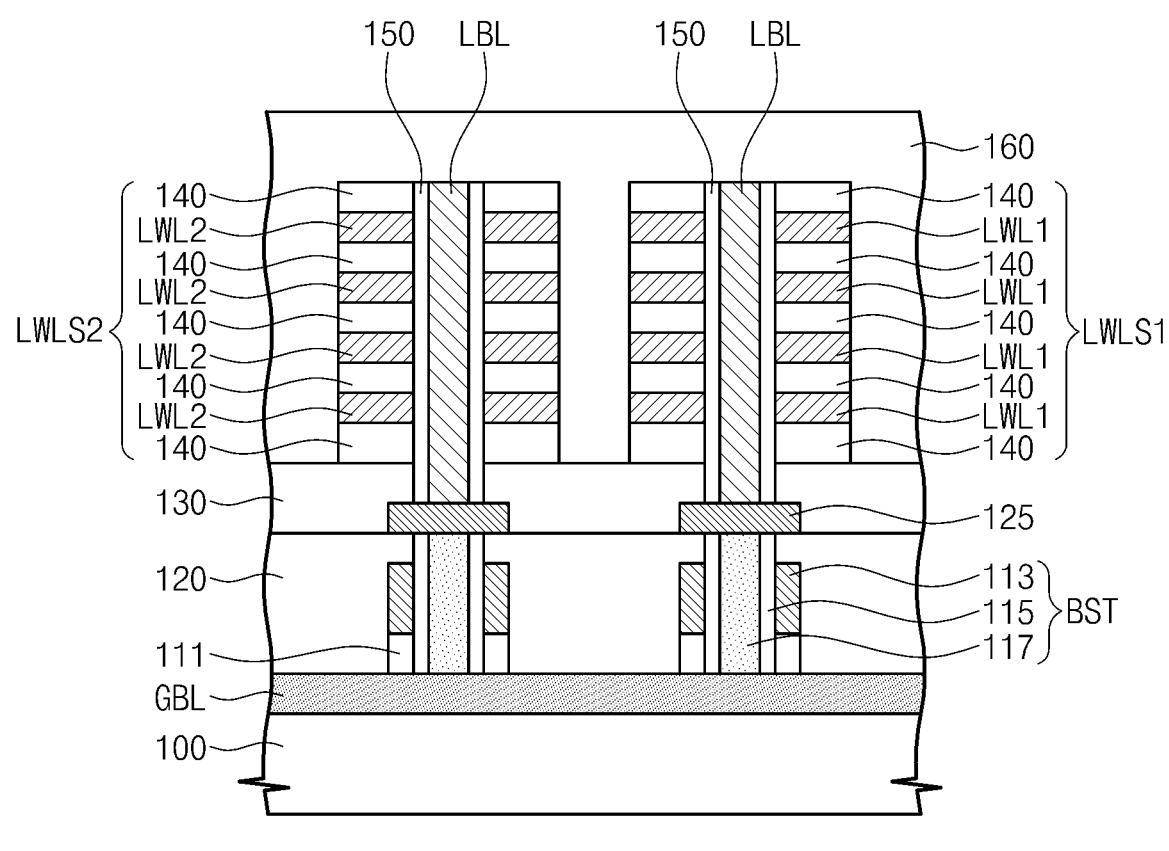

FIGS. 5A and 6A are cross-sectional views respectively taken along lines V-V' and VI-VI' of FIG. 3 to explain a semiconductor device according to example embodiments of inventive concepts.

Referring to FIGS. 3, 4, 5A and 6A, a substrate 100 may include a first connection region CNR1, a second connection region CNR2, and a cell array region CAR disposed between the first and second connection regions CNR1 and CNR2.

The substrate 100 may include one of a material having a semiconductor characteristic (e.g. a silicon wafer), an insulating material (e.g., a glass), and a semiconductor or a conductor covered by an insulating material.

A plurality of memory blocks BLK may be disposed on the substrate 100, and each of the memory blocks BLK may include a memory cell array including three-dimensional arranged memory cells. As illustrated in FIG. 3, the memory blocks BLK may be arranged in the y-axis direction and be spaced apart from each other in the y-axis direction.

The memory cell array may be disposed on the substrate of the cell array region CAR. The local bitline selection unit 20 of FIG. 2 may be disposed between the memory cell array and the substrate 100 of the cell array region CAR. That is, the local bitline selection unit 20 and the memory cell array may be vertically and sequentially stacked on the substrate 100 of the cell array region CAR. The first local wordline selection unit 10a of FIG. 2 connecting the first local wordline LWL1 to the first global wordlines GWL1 may be disposed on the substrate 100 of the first connection region CNR1. The second local wordline selection unit 10b of FIG. 2 connecting the second local wordline LWL2 to the second global wordlines GWL2 may be disposed on the substrate 100 of the first connection region CNR2.

According to example embodiments of inventive concepts, the first local wordlines LWL1, the second local wordlines LWL2, and the local bitlines LBL may be disposed on the substrate 100 of the cell array region CAR. The memory cells may be disposed at cross points of the local wordlines LWL1 and LWL2 and the local bitlines LBL, respectively.

In more detail, a plurality of first local wordline structures LWLS1 may be disposed on the substrate 100 of the cell array region CAR. Second wordline structures LWLS2 may be disposed between the first local wordline structures LWLS2. According to example embodiments, as illustrated in FIGS. 3 and 4, the first local wordline structures LWLS1 and the second local wordline structures LWLS2 may be alternately arranged in the y-axis direction when viewed from a top view. As illustrated in FIGS. 5A to 5C and 6A to 6C, each of the first local wordline structures LWLS1 may include first local wordlines LWL1 stacked with insulating layers 140 therebetween, and each of the second local wordline structures LWLS2 may include second local wordlines LWL2 stacked with insulating layers 140 therebetween. The stack number of the first local wordlines LWL1 constituting each of the local wordline structures LWLS1 may be 2n where the n is a natural number. The stack number of the second local wordlines LWL2 constituting each of the local wordline structures LWLS2 may be equal to the stack number of the first local wordlines LWL1 constituting each of the local wordline structures LWLS1. The stacked first local wordlines LWL1 may be vertically spaced apart from each other by the insulating layers 140. The stacked second local wordlines LWL2 may also be vertically spaced apart from each other by the insulating layers 140.

The first and second local wordlines LWL1 and LWL2 may include at least one of a semiconductor material doped with dopants (e.g., doped silicon, doped germanium, and/or doped silicon-germanium), a conductive metal nitride (e.g., titanium nitride and/or tantalum nitride), a metal silicide (e.g., tungsten silicide and/or cobalt silicide), and metal (e.g., titanium, tantalum, tungsten, and/or aluminum). The insulating layers 140 may be formed of a dielectric such as an oxide, nitride, and/or oxynitride, for example silicon oxide, silicon nitride, and/or silicon oxynitride; however, example embodiments of inventive concepts are not limited thereto.

As described with reference to FIG. 2, in the first local wordline structures LWLS1 in one memory block BLK, the first local wordlines LWL1 disposed at the same height form the substrate 100 may be electrically connected to each other. And, in the second local wordline structures LWLS2 in one memory block BLK, the second local wordlines LWL2 disposed at the same height form the substrate 100 may be electrically connected to each other. As shown in 6A to 6C, the first and the second local wordlines LWL1 and LWL2 may disposed at the same height may be electrically insulated from each other.

Referring to FIGS. 3, 4, and 6A to 6C, the first local wordlines LWL1 disposed at the same height from the substrate 100 in one memory block BLK may be connected in common to a first connecting pad PAD1 disposed in the first connection region CNR1. The one memory block BLK may have first connecting pads PAD1 which are stacked to constitute a stepped shape. The number of the stacked first connecting pads PAD1 in the one memory block BLK is equal to the number of the stacked first local wordlines LWL1. A plane area of the first connecting pad PAD1 disposed at a relatively higher height from the substrate 100 may be less than a plane area of the first connecting pad PAD1 disposed at a relatively lower height from the substrate 100. In other words, a sidewall of the first connecting pad PAD1 disposed at a relatively higher height may be more adjacent to the cell array region CAR than a sidewall of the first connecting pad PAD1 disposed at a relatively lower height.

According to example embodiments of inventive concepts, the second local wordlines LWL2 disposed at the same height from the substrate 100 in the one memory block BLK may be connected in common to a second connecting pad PAD2 disposed in the second connection region CNR2. The one memory block BLK may have second connecting pads PAD2 which are stacked to constitute a stepped shape. The number of the stacked second connecting pads PAD2 in the one memory block BLK is equal to the number of the stacked second local wordlines LWL2. A plane area of the second connecting pad PAD2 disposed at a relatively higher height may be less than a plane area of the second connecting pad PAD2 disposed at a relatively lower height from the substrate 100. In other words, a sidewall of the second connecting pad PAD2 disposed at a relatively higher height may be more adjacent to the cell array region CAR than a sidewall of the second connecting pad PAD2 disposed at a relatively lower height.

The first and second connecting pads PAD1 and PAD2 may be formed simultaneously with the first and second local wordlines LWL1 and LWL2 disposed at the same height as the first and second connecting pads PAD1 and PAD2. Thus, the first and second local wordlines LWL1 and LWL2 and the first and second connecting pads PAD1 and PAD2, which are disposed at the same height, may have the same thickness and the same material as each other. The first connecting pad PAD1 may be electrically and physically separated from the second connecting pad PAD2. Thus, different voltages from each other may be applied to the first and second local wordlines LWL1 and LWL2 being horizontally adjacent to each other, respectively. As a result, when the semiconductor memory device is operated, it is possible to decrease interference between the memory cells adjacent to each other.

According to example embodiments of inventive concepts, the one memory block BLK may have one first stacked structure, and the first stacked structure may include a plurality of first wordline structures stacked on the substrate. Here, each of the first wordline structures may include at least one first local wordlines LWL1 disposed at the same height from the substrate 100 and extending in the x-axis direction, and one first connecting pad PAD1 extending in the y-axis direction in the first connection region CNR1 and being connected in common to the first local wordlines LWL1.

Additionally, the one memory block BLK may have one second stacked structure, and the second stacked structure may include a plurality of second wordline structures stacked on the substrate. Here, each of the second wordline structures may include at least one second local wordlines LWL2 disposed at the same height from the substrate 100 and extending in the x-axis direction, and one second connecting pad PAD2 extending in the y-axis direction in the second connection region CNR2 and being connected in common to the second local wordlines LWL2.

Moreover, as described with reference to FIG. 2, the semiconductor memory device may be configured to independently apply different voltages from each other to the first and second local wordlines LWL1 and LWL2 respectively disposed at different heights from each other. To achieve this, it is required to electrically separate the first and second local wordlines LWL1 and LWL2 disposed at different heights from each other. Accordingly, the one memory block BLK may include first interconnections INC1 corresponding to the stack number of the first local wordlines LWL1, and second interconnections INC2 corresponding to the stack number of the second local wordlines LWL2.

The first interconnections INC1 may be disposed over the substrate 100 in the first connection region CNR1 to connect the first local wordlines LWL1 to the first global wordlines GWL1 using contact plugs CP, respectively. The first connection interconnections INC1 may be disposed at the same height from the substrate 100. The first interconnections INC1 may be connected to the first connecting pads PAD1 through the contact plugs CP, respectively. The first interconnections INC1 may be connected to the first wordline selection transistor WST1 illustrated in FIG. 2, respectively. Thus, the first local wordlines LWL1 disposed at different heights from each other may be controlled independently.

Likewise, the second interconnections INC2 may be disposed over the substrate 100 in the second connection region CNR2 to connect the second local wordlines LWL2 to the second global wordlines GWL2 using contact plugs CP, respectively. The second connection interconnections INC2 may be disposed at the same height from the substrate 100. The second interconnections INC2 may be connected to the second connecting pads PAD2 through the contact plugs CP, respectively. The second interconnections INC2 may be connected to the second wordline selection transistor WST2 illustrated in FIG. 2, respectively. Thus, the second local wordlines LWL2 disposed at different heights from each other may be controlled independently.

If the number of the first local wordlines LWL1 or the second local wordlines LWL2 connected in common to each of the first and second connecting pads PAD1 and PAD2 increases, since the same voltage is applied to the first local wordlines LWL1 or the second local wordlines LWL2 disposed at the same height, electrical paths through non-selected memory cells may increases to increase a leakage current. Thus, the semiconductor memory device according to example embodiments of inventive concepts can be configured to reduce (and/or minimize) the leakage current through the non-selected memory cells. To reduce (and/or minimize) the leakage current through the non-selected memory cells, the numbers of the first and second local wordlines LWL1 and LWL2 connected in common to the first and second connecting pads PAD1 and PAD2 are reduced (and/or minimized).

Additionally, for electrically separating the first and second local wordlines LWL1 and LWL2 disposed at different heights from each other, the first interconnections INC1 corresponding to the stack number of the first local wordlines LWL1 being stacked may be disposed in the one memory block BLK, and the second interconnections INC2 corresponding to the stack number of the second local wordlines LWL2 being stacked may be disposed in the one memory block BLK. The first and second interconnections INC1 and INC2 may be disposed at the same height from the substrate 100.

To satisfy the above conditions, in semiconductor memory devices according to example embodiments of inventive concepts, a length L of each of the first and second connecting pads PAD1 and PAD2 may be configured to satisfy the following mathematical formula 1.

$$L \approx P \times 2n \qquad \text{[Mathematical formula 1]}$$

Where the P is a minimum horizontal pitch of the first interconnections INC1 or the second interconnections INC2, and the 2n (n is a natural number) is the stack number of the stacked first local wordlines LWL1 or the stacked second local wordlines LWL2. The length L of each of the first and second connecting pads PAD1 and PAD2 means a length along the y-axis direction illustrated in drawings. According to example embodiments of inventive concepts, a length of each of the memory blocks BLK along the y-axis direction may be substantially equal to the length L of the first and second connecting pads PAD1 and PAD2.

The minimum horizontal pitch P of the first interconnections INC1 or the second interconnections INC2 may be defined as a sum of a minimum width of the first or second interconnection INC1 or INC2 and a minimum space between the first interconnections INC1 or the second interconnections INC2. The minimum width and the minimum space may be determined by a semiconductor process technique (e.g., a design rule). According to example embodiments of inventive concepts, the minimum horizontal pitch P of the first interconnections INC1 or the second interconnections INC2 may be two times of a minimum feature size realized by a photolithography process and an etch process in a design rule of the three-dimensional semiconductor memory device. In other words, the minimum horizontal pitch P of the first or second interconnections INC1 or INC2 may be a sum of a width of a minimum feature obtained by the photolithography and etch processes and a distance between adjacent features.

Additionally, according to example embodiments of inventive concepts, the number of the first local wordlines LWL1 or the second local wordlines LWL2 connected in common to each of the first or second connecting pads PAD1 or PAD2 may be determined depending on a width W of each of the first or second local wordlines LWL1 or LWL2. According to example embodiments of inventive concepts, the widths W of the first and second local wordlines LWL1 and LWL2 may be substantially equal to each other. The widths W of the first and second local wordlines LWL1 and LWL2 may be determined by a photolithography process and an etch process in a step patterning a thin layer structure consisting of stacked conductive layers with insulating layers therebetween. The substrate 100 may be exposed in the step patterning the thin layer structure. At this time, since an etching depth is greater, the width W of each of the first and second local wordlines LWL1 and LWL2 may be greater than a width of each of the first and second interconnections INC1 and INC2.

In more detail, the number of the first local wordlines LWL1 or the second local wordlines LWL2 connected in common to each of the first or second connecting pads PAD1 or PAD2 may be configured to satisfy the following mathematical formula 2 in the semiconductor memory device according to example embodiments of inventive concepts.

$$N < L/2(W+S) \qquad \text{[Mathematical formula 2]}$$

Where the L is a length of the first or second connecting pads PAD1 or PAD2, the W is a width of the first or second wordline structure LWLS1 or LWLS2, and the S is a space between the first and second local wordline structures LWLS1 and LWLS2.

Furthermore, referring to FIGS. 3, 5A, and 6A, a planarization insulating layer 160 may cover the first local wordline structure LWLS1 and the second local wordline structure LWLS2. The planarization insulating layer 160 may fill a gap between the first and second local wordlines structures LWLS1 and LWLS2 and may cover top surfaces of the first and second connecting pads PAD1 and PAD2 stacked in the stepped shapes.

The first and second interconnections INC1 and INC2 may be disposed on the planarization insulating layer 160. The first and second interconnections INC1 and INC2 may be respectively connected to the first and second connecting pads PAD1 and PAD2 through the contact plugs CP.

The local bitlines LBL may penetrate the first local wordline structure LWLS1 and the second local wordline structure LWLS2. Alternatively, the local bitlines LBL may vertically cross sidewalls of the first and second local wordline structures LWLS1 and LWLS2. In this case, the first and second local wordlines LWL1 and LWL2 horizontally adjacent to each other may share the local bitlines LBL.

The local bitlines LBL may have a pillar shape substantially vertical to the top surface of the substrate 100. Each of the local bitlines LBL may be electrically connected to the bitline selection transistor BST.

The local bitlines LBL may be formed of a conductive material. For example, the local bitlines LBL may include at least one of a semiconductor material doped with dopants (e.g., doped silicon, doped germanium, and/or doped silicon-germanium), a conductive metal nitride (e.g., titanium nitride and/or tantalum nitride), a metal silicide (e.g., tungsten silicide and/or cobalt silicide), and metal (e.g., titanium, tantalum, tungsten, and/or aluminum). According to example embodiments of inventive concepts, top surfaces of the local bitlines LBL may be covered by the planarization insulating layer 160. According to example embodiments of inventive concepts, the top surfaces of the local bitlines LBL may be directly in contact with the planarization insulating layer 160.

According to example embodiments of inventive concepts, a resistive memory element layer 150 may be disposed the local bitlines LBL and the local wordline structures LWLS1 and LWLS2. Additionally, selection components (not shown) may be disposed between the resistive memory element layer 150 and the local wordline structures LWLS1 and LWLS2. The selection components (not shown) may be PN junction or PIN junction diodes.

According to example embodiments of inventive concepts, the resistive memory element layer 150 may include a material reversibly switched between at least two resistive states clearly distinguished from each other by voltages applied to both ends thereof. For example, the resistive memory element layer 150 may include an insulating material showing perovskite crystal habit, an insulating metal oxide represented as MOx, or any combination thereof. The insulating material showing perovskite crystal habit may have a so-called 'ABO3' structure. However, the insulating material showing perovskite crystal habit is not limited thereto. The insulating material showing perovskite crystal habit may include PbZr-TiO3, PrCaMnO3, (Ba, Sr)TiO3 doped with calcium, and/or SrZrO3. The M in the insulating metal oxide MOx is metal. The metal M may include transition metal. In other words, the insulating metal oxide MOx may include transition metal oxide and/or precious metal oxide. However, the metal in the insulating metal oxide MOx is not limited to the transition metal. For example, the insulating metal oxide MOx may include nickel (Ni), niobium (Nb), titanium (Ti), zirconium (Zr), hafnium (Hf), cobalt (Co), iron (Fe), copper (Cu), manganese (Mn), or chromium (Cr). The insulating metal oxide MOx may also contain impurities such as lithium (Li), calcium (Ca), or lanthanum (La).

According to example embodiments of inventive concepts, the resistive memory element layer 150 may include a phase change material of which resistivity is changed by a temperature of a supply heat and/or a supplying time of the supply heat. For example, the resistive memory element layer 150 may be formed of a compound including at least one of Te and Se being chalcogenide elements, and at least one selected from a group consisting of Ge, Sb, Bi, Pb, Sn, Ag, As, S, Si, P, O, and N.

According to example embodiments of inventive concepts, the resistive memory element layer 150 may include a magnetic tunnel junction (MTJ) of which a resistance is changed according to magnetization directions of a free layer and a fixed layer.

As illustrated in FIGS. 5A and 6A, the global bitlines GBL may be disposed on the substrate 100 of the cell array region CAR to cross the first and second local wordline structures LWLS1 and LWLS2. The global bitlines GBL may be impurity regions formed by doping impurities into active regions defined by device isolation patterns 102.

The local bitline selection unit 20 of FIG. 2 (e.g., the bitline selection transistors BST) may be disposed between the substrate 100, and the local wordlines structures LWLS1 and LWLS2. According to example embodiments of inventive concepts, the first and second local wordline structures LWLS1 and LWLS2 may be disposed on an interlayer insulating layer 120 covering the bitline selection transistors BST.

In more detail, the local bitline selection unit 20 of FIG. 2 may include a plurality of the bitline selection transistors BST as described with reference to FIG. 2. Each of the bitline selection transistors BST may include a gate pattern 113 crossing the global bitlines GBL, at least one vertical channel pillar 117 penetrating the gate pattern 113 to be in contact with each of the global bitlines GBL, and a gate insulating layer 115 between the gate pattern 113 and a sidewall of the vertical channel pillar 117.

The vertical channel pillars 117 may be disposed at cross points of the global bitlines GBL and the local bitlines LBL, respectively. A bitline pad pattern 125 may be disposed between each of the local bitlines LBL and each of the vertical channel pillars 117. According to example embodiments of inventive concepts, each of the bitline selection transistors BST may include a plurality of the vertical channel pillars 117 penetrating the gate pattern 113.

As shown in FIG. 5A, a middle insulating interlayer 130 may be formed between a lowermost insulating layer 140 and the interlayer insulator 120. The middle insulating interlayer 130 may include a dielectric material, such as an oxide, a nitride, and/or an oxynitride.

A plurality of the gate patterns 113 may be disposed on the substrate 100 to extend side by side in the x-axis direction. An insulating pattern 111 may be disposed between each of the gate patterns 113 and the substrate 100. The plurality of the gate patterns 113 may be disposed under the first and second wordline structures LWLS1 and LWLS2 in a vertical view. The gate patterns 113 may extend in parallel with the first and second local wordline structures LWLS1 and LWLS2 and cross over the global bitlines GBL. The gate patterns 113 may correspond to gate electrodes of the bitline selection transistors BST.

An electric potential of the vertical channel pillar 117 may be controlled by a voltage applied to the gate pattern 113. In other words, the vertical channel pillar 117 and the gate pattern 113 may constitute a MOS capacitor.

The interlayer insulating layer 120 may be disposed on an entire surface of the substrate 100. The interlayer insulating layer 120 may cover the gate patterns 113 and may fill gaps between the gate patterns 113. The interlayer insulating layer 120 may have a planarized top surface. The interlayer insulating layer 120 may include a dielectric, such as an oxide, nitride, and/or oxynitride, for example silicon oxide, silicon nitride, and/or silicon oxynitride. However, example embodiments of inventive concepts are not limited thereto.

One or more vertical channel pillar 117 may successively penetrate the interlayer insulating layer 120, the gate pattern 113, and the insulating pattern 111 to be connected to the global bitline GBL. The gate insulating layer 115 is disposed between the vertical channel pillar 117 and the gate pattern 113.

A top surface of the vertical channel pillar 117 may be substantially coplanar with a top surface of the interlayer insulating layer 120. The vertical channel pillar 117 may be formed of a semiconductor material. The vertical channel pillar 117 may be an epitaxial layer obtained by performing a selective epitaxial growth (SEG) process. The vertical channel pillar 117 may be doped with dopants of a conductivity type different from the global bitline GBL. Alternatively, the vertical channel pillar 117 may be an undoped material. The bitline selection transistors BST of FIG. 2 may have vertical channels by the vertical channel pillars 117.

The bitline pad pattern 125 may be disposed on the top surface of the vertical channel pillar 117. The bitline pad pattern 125 may be directly in contact with the local bitline LBL. The bitline pad pattern 125 may provide an ohmic contact between the vertical channel pillar 117 of the semiconductor material and the local bitline LBL of the conductive material. The bitline pad pattern 125 may be formed of a conductive metal nitride (e.g., titanium nitride or tantalum nitride) and/or a metal silicide (e.g., tungsten silicide or cobalt silicide).

Even though not shown, the first and second wordline selection transistors WST1 and WST2 of FIG. 2 may have substantially the same shape as the bitline selection transistor BST.

Figure 5B:
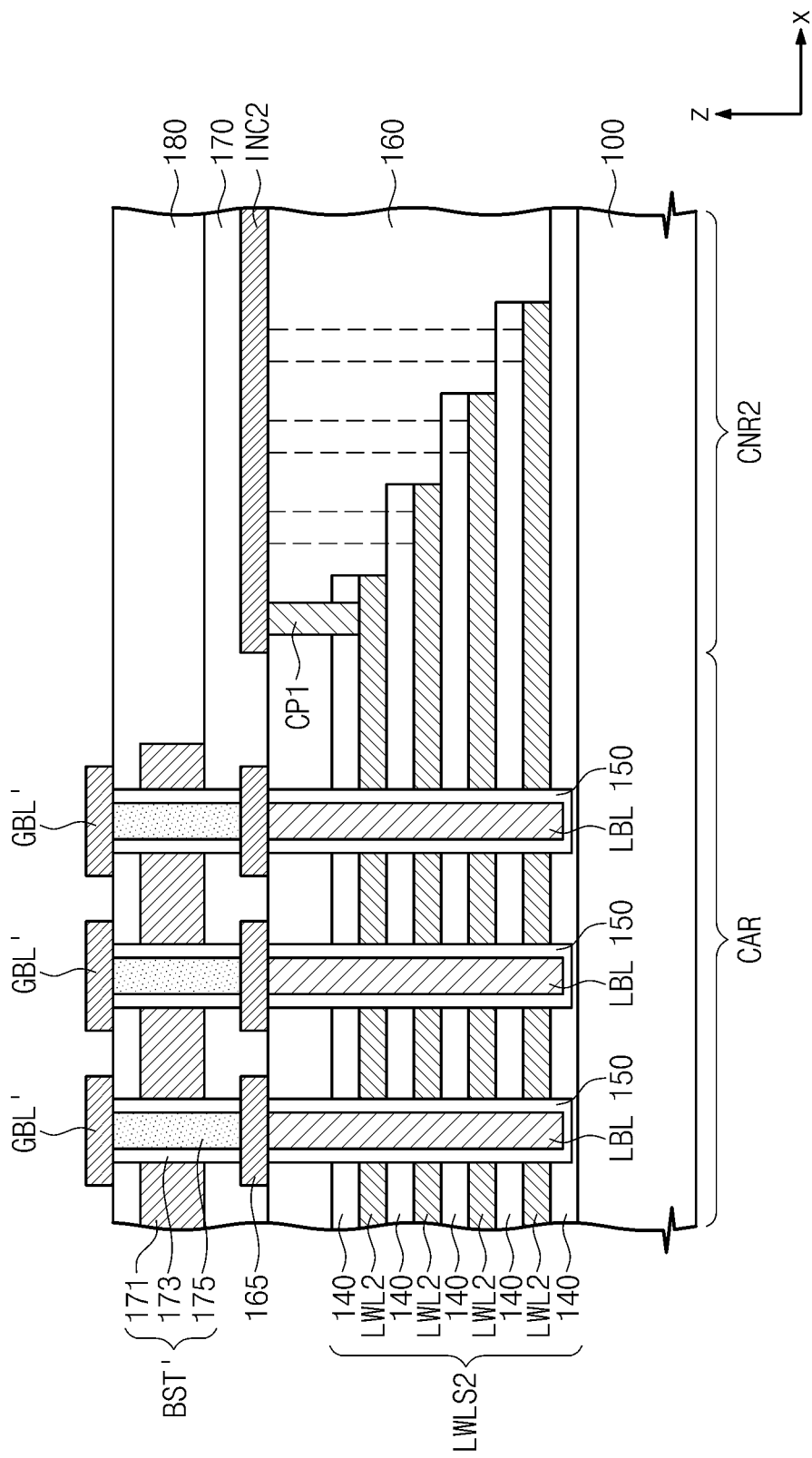
FIGS. 5B and 6B are cross-sectional views respectively taken along lines V-V' and VI-VI' of FIG. 3 to explain a semiconductor device according to example embodiments of inventive concepts.
Figure 6B:
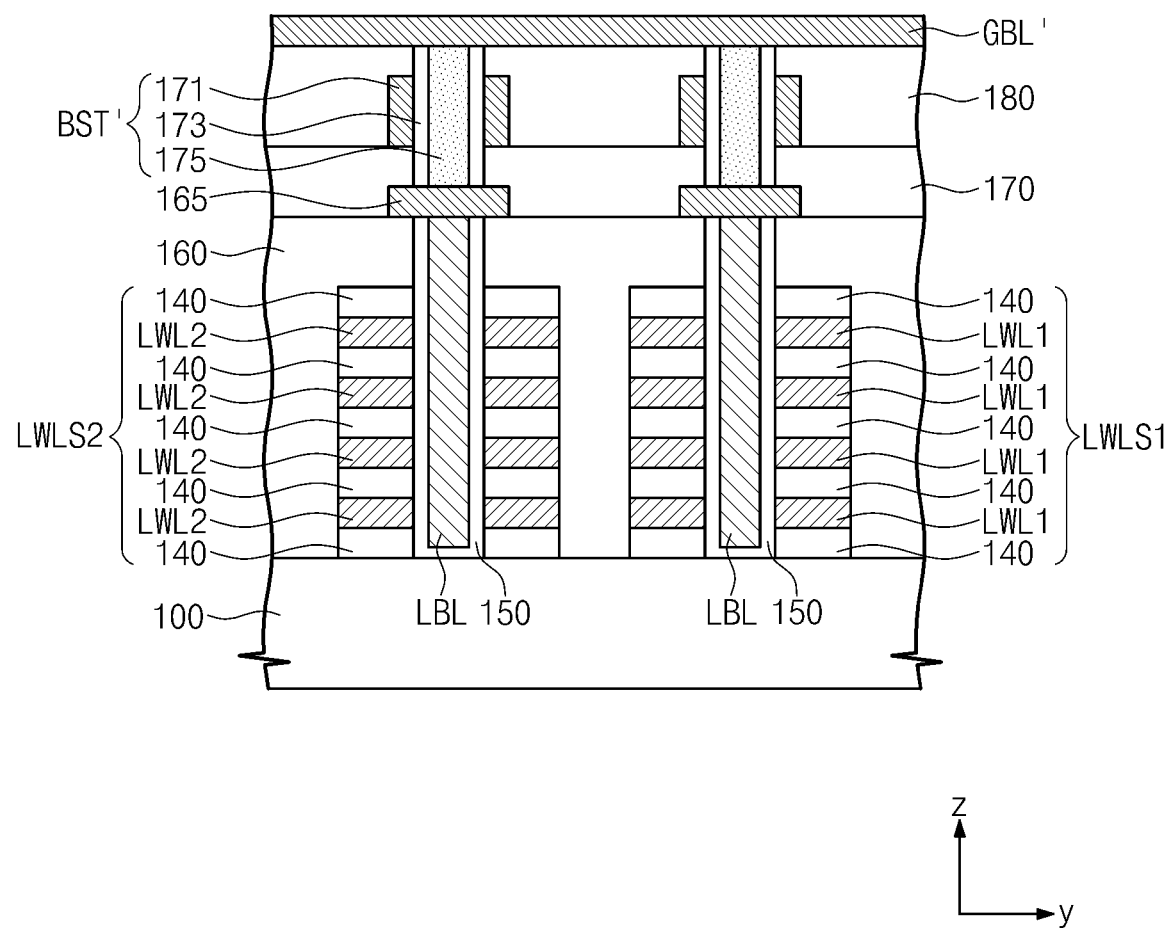

FIGS. 5B and 6B are cross-sectional views respectively taken along lines V-V' and VI-VI' of FIG. 3 to explain a semiconductor device according to example embodiments of inventive concepts.

In a semiconductor memory device illustrated in FIGS. 5B and 6B, the same elements as described in FIGS. 5A and 6A will be indicated by the same reference numerals or the same reference designators, and the descriptions to the same elements as in FIGS. 5A and 6A will be omitted or mentioned briefly.

Referring to FIGS. 5B and 6B, the first and second local wordline structures LWLS1 and LWLS2 may be disposed between the substrate 100 and the local bitline selection unit (e.g., the bitline selection transistors BST) in a vertical view.

In more detail, an insulating layer 140 may be disposed on the substrate 100 and the first and second wordline structures LWLS1 and LWLS2 may be disposed on the insulating layer 140.

The local bitlines LBL may penetrate the first and second local wordline structures LWLS1 and LWLS2 as illustrated in FIG. 3. Alternatively, the local bitlines LBL may vertically cross the sidewalls of the first and second local wordline structures LWLS1 and LWLS2 as illustrated in FIG. 4.

The resistive memory element layer 150 may be disposed between the local bitlines LBL and the local wordline structures LWLS1 and LWLS2. The resistive memory element layer 150 may extend onto a bottom surface of the local bitline LBL. In other words, the resistive memory element layer 150 may also be disposed between the bottom surface of the local bitline LBL and the substrate 100. A bitline pad pattern 165 may be disposed on a top surface of each of the local bitlines LBL.

The first and second interconnections INC1 and INC2 may be disposed the planarization insulating layer 160 covering the first and second local wordline structures LWLS1 and LWLS2. The first and second interconnections INC1 and INC2 may be connected to the first and second connecting pads PAD1 and PAD2 through the contact plugs CP, respectively.

The bitline selection transistors BST' may be disposed on the planarization insulating layer 160. Each of the bitline selection transistors BST' may include a gate pattern 171 crossing global bitlines GBL', and at least one vertical channel pillar 175 penetrating the gate pattern 171 to be in contact with the bitline pad pattern 165.

In more detail, a plurality of the gate patterns 171 may extend in parallel with the first and second wordline structures LWLS1 and LWLS2. An insulating pattern 170 may be disposed between the gate patterns 171 and the planarization insulating layer 160. An interlayer insulating layer 180 may cover the gate patterns 171.

The vertical channel pillar 175 may successively penetrate the insulating layer 120, the gate pattern 171, and the insulating pattern 170 to be connected to the bitline pad pattern 165. A gate insulating layer 173 is disposed between the vertical channel pillar 175 and the gate pattern 171. The vertical channel pillar 175 may be formed using a portion of a dummy semiconductor substrate bonded to the insulating pattern 170. Alternatively, the vertical channel pillar 175 may be an epitaxial layer formed using a selective epitaxial growth (SEG) process.

The global bitlines GBL' may be disposed on top surfaces of the vertical channel pillars 175. The global bitlines GBL' may cross over the first and second wordline structures LWLS1 and LWLS2. The global bitlines GBL' may be conductive patterns formed by pattering a conductive layer on the interlayer insulating layer 180.

Figure 5C:
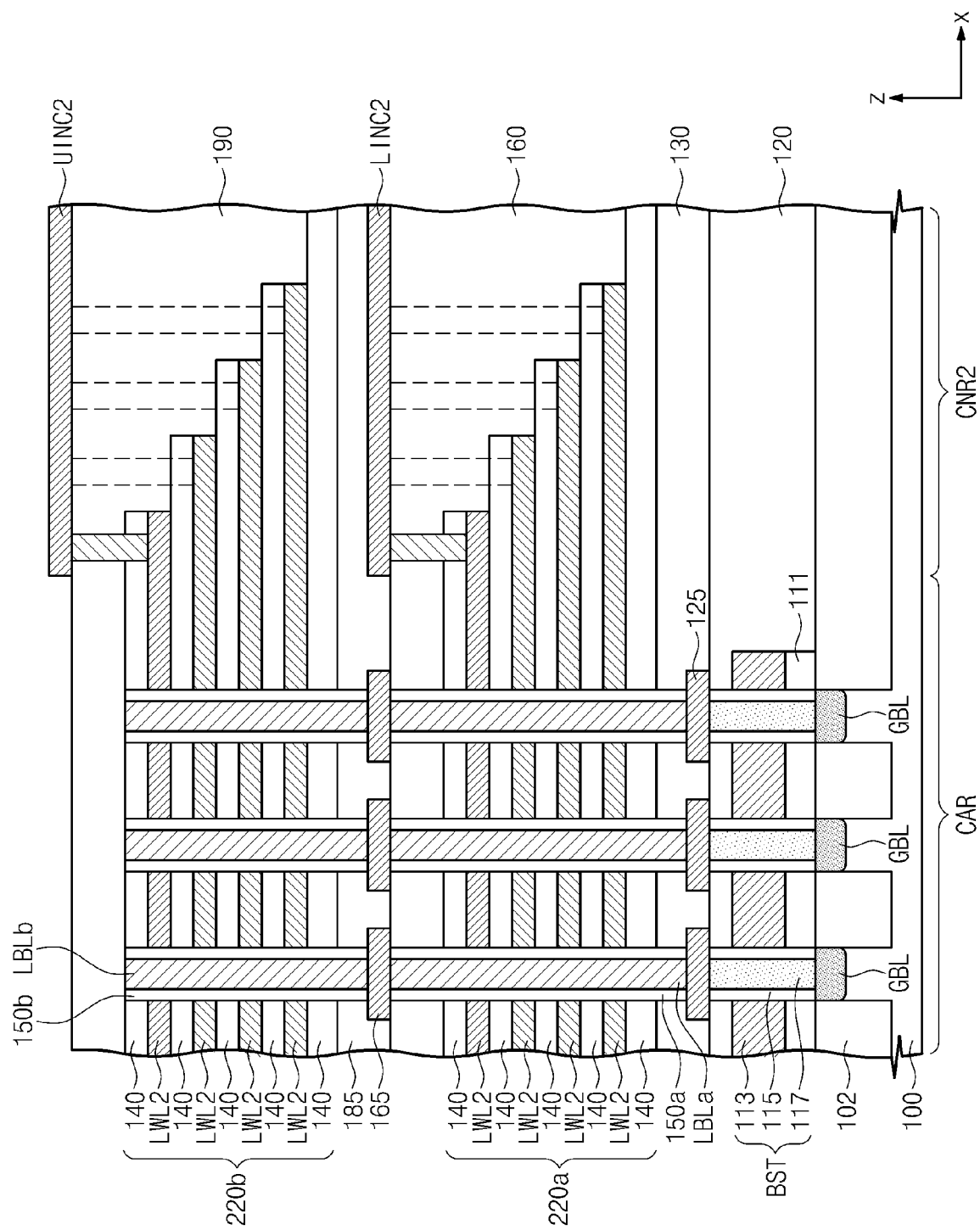
FIGS. 5C and 6C are cross-sectional views respectively taken along lines V-V' and VI-VI' of FIG. 3 to explain a semiconductor device according to example embodiments of inventive concepts.
Figure 6C:
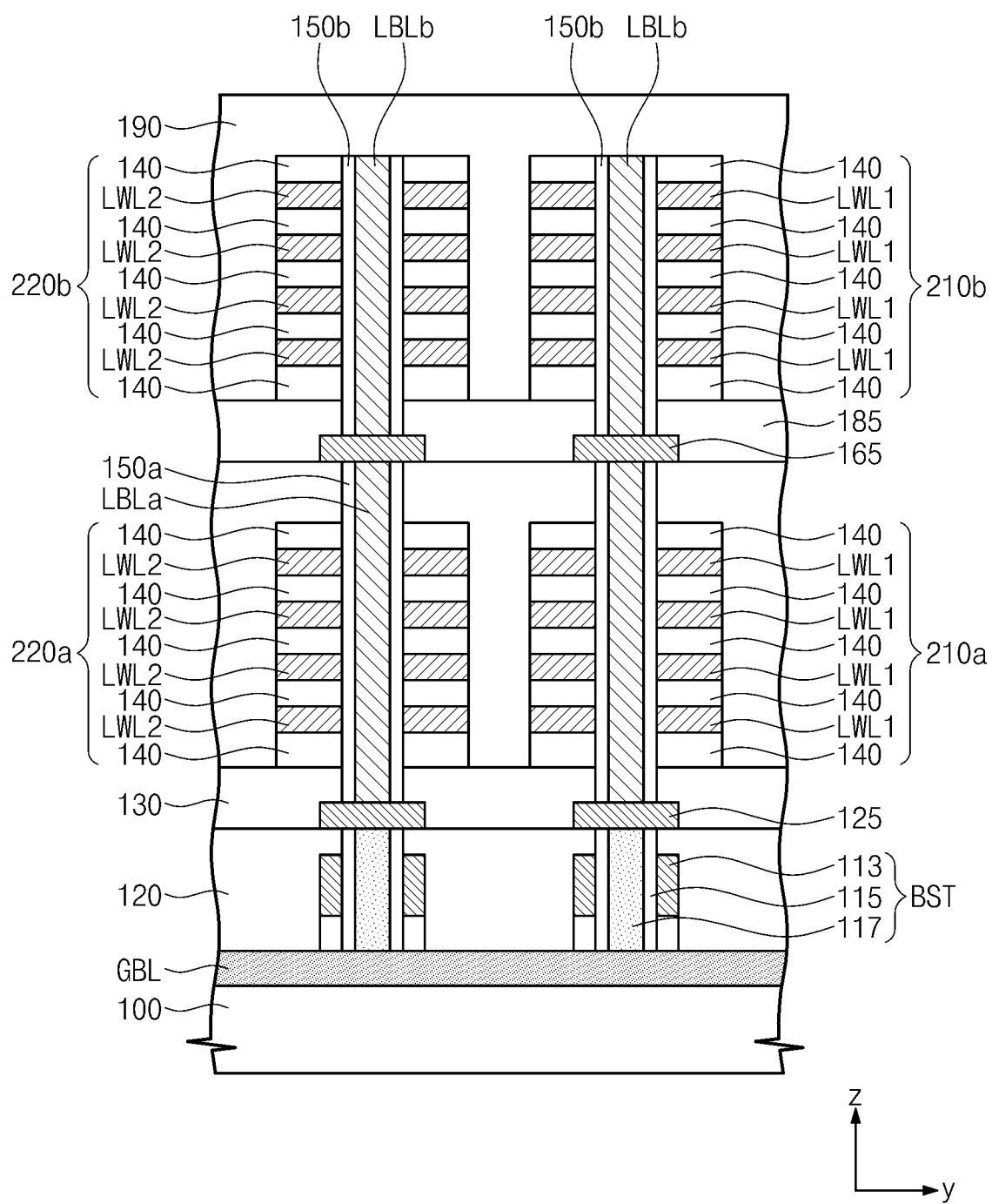

FIGS. 5C and 6C are cross-sectional views respectively taken along lines V-V' and VI-VI' of FIG. 3 to explain a semiconductor device according to example embodiments of inventive concepts.

As illustrated in FIGS. 5C and 6C, first local wordline structures may be sequentially stacked on the substrate 100 and second local wordline structures may be sequentially stacked on the substrate 100. These points may be distinguished from the above the drawings in FIGS. 5A and 6a. Thus, since the first local wordline structures are stacked and the second local wordline structures are stacked, it is possible to improve the integration of the semiconductor memory device.

In more detail, referring to FIGS. 5C and 6C, first and second lower local wordline structures 210a and 220a may be disposed on the substrate 100.

The first lower local wordline structures 210a may extend in the x-axis direction as illustrated in FIGS. 3 and 4, and the second lower local wordline structures 220a may be disposed between the first lower local wordline structures 220a.

Each of the first lower local wordline structures 210a may include stacked first local wordlines LWL1 with insulating layers 140 therebetween. Each of the second lower local wordline structures 220a may include stacked second local wordlines LWL2 with insulating layers 140 therebetween.

In the first lower local wordline structures 210a, the first local wordlines LWL1 disposed at the same height from the substrate 100 may be electrically connected to each other by the first connecting pad PAD1 in the first connection region CNR1 as illustrated in FIGS. 3 and 4. In the second lower local wordline structures 220a, the second local wordlines LWL2 disposed at the same height from the substrate 100 may be electrically connected to each other by the second connecting pad PAD2 in the second connection region CNR2 as illustrated in FIGS. 3 and 4. Additionally, the first and second local wordlines LWL1 and LWL2 horizontally adjacent to each other may be electrically insulated from each other.

A lower planarization insulating layer 160 may cover the first and second lower local wordline structures 210a and 220a, and first lower interconnections (not shown) and second lower interconnections LINC2 may be disposed on the lower planarization insulating layer 160. As described with reference to FIGS. 3 and 4, the first lower interconnections (not shown) and the second lower interconnections LINC2 may be disposed to independently apply different voltages from each other to the first and second wordlines LWL1 and LWL2 disposed at different heights from each other. In other words, each of the memory blocks BLK may include the first lower interconnections (not shown) corresponding to the stack number of the first local wordlines LWL1, and the second lower interconnections LINC2 corresponding to the stack number of the second local wordlines LWL2. The first lower interconnections (not shown) may be connected to the first wordline selection transistors WST1 illustrated in FIG. 2, respectively. The second lower interconnections LINC2 may be connected to the second wordline selection transistors WST2 illustrated in FIG. 2, respectively.

A length of the first or second connecting pad PAD1 or PAD2 and a minimum horizontal pitch of the first or second lower interconnections LINC2 may satisfy the mathematical formula 1 described above.

Lower local bitlines LBLa may penetrate the lower planarization insulating layer 160 and the first and second lower local wordline structures 210a and 220a in the cell array region CAR as illustrated in FIG. 3. Alternatively, as illustrated in FIG. 4, the lower local bitlines LBLa may vertically cross sidewalls of the first and second lower local wordline structures 210a and 220a in the cell array region CAR, and the first and second lower local wordline structures 210a and 220a may share the lower local bitlines LBLa. An upper bitline pad pattern 165 may be formed on a top surface of each of the lower local bitlines LBLa.

A middle insulating layer 185 may be disposed on the lower planarization insulating layer 160 to cover the first and second lower interconnections LINC2 and the upper bitline pad patterns 165. First and second upper local wordline structures 210b and 220b may be disposed on the middle insulating layer 185. The first upper local wordline structures 210b may be disposed to be in parallel with the first lower local wordline structures 210a, and the second upper local wordline structures 220b may be disposed to be in parallel with the second lower local wordline structures 220a. Each of the first upper local wordline structures 210b may include stacked first local wordlines LWL1 with insulating layers 140 therebetween. Each of the second upper local wordline structures 220b may include stacked second local wordlines LWL2 with insulating layers 140 therebetween.

In the first upper local wordlines 210b, the first local wordlines LWL1 disposed at the same height from the substrate 100 may be electrically connected to each other by a first connecting pad PAD1 in the first connection region CNR1 as illustrated in FIGS. 3 and 4. In the second upper local wordline structures 220b, the second local wordlines LWL2 disposed at the same height from the substrate 100 may be electrically connected to each other by a second connecting pad PAD2 in the second connection region CNR2 as illustrated in FIGS. 3 and 4. Additionally, in the first and second upper local wordline structures 210b and 220b, the first and second local wordlines LWL1 and LWL2 horizontally adjacent to each other may be electrically insulated from each other.

Upper local bitlines LBLb may penetrate the first and second upper local wordline structures 210b and 220b in the cell array region CAR to be connected to the upper bitline pad patterns 165, respectively, as illustrated in FIG. 3. Alternatively, as illustrated in FIG. 4, the upper local bitlines LBLb may vertically cross sidewalls of the first and second upper local wordline structures 210b and 220b in the cell array region CAR to be connected to the upper bitline pad patterns 165, respectively.

According to example embodiments of inventive concepts, the lower and upper local bitlines LBLa and LBLb may be vertically stacked, and the stacked lower and upper local bitlines LBLa and LBLb may be electrically connected to each other.

An upper planarization insulating layer 190 may cover the first and second upper local wordline structures 210b and 220b and the upper local bitlines LBLb. First upper interconnections (not shown) and second upper interconnections UINC2 may be disposed on the upper planarization insulating layer 190. As described with reference to FIGS. 3 and 4, the first and second upper interconnections UINC2 may be disposed to independently apply different voltages from each other to the first and second wordlines LWL1 and LWL2 disposed at different heights from each other in the first and second upper local wordline structures 210b and 220b. In other words, each of the memory blocks BLK may include the first upper interconnections (not shown) corresponding to the stack number of the first local wordlines LWL1 constituting the first upper local wordline structure 210b. And the second upper interconnections UINC2 corresponding to the stack number of the second local wordlines LWL2 constituting the second upper local wordline structure 220b.

The first upper interconnections (not shown) may be connected to the first wordline selection transistors WST1 illustrated in FIG. 2, respectively. The second upper interconnections UINC2 may be connected to the second wordline selection transistors WST2 illustrated in FIG. 2, respectively.

According to example embodiments of inventive concepts, a length of the first or second connecting pad PAD1 or PAD2 of the first or second upper local wordline structure 210b or 220b and a minimum horizontal pitch of the first or second upper interconnections UINC2 may satisfy the mathematical formula 1 described above.

According to example embodiments of inventive concepts, the local bitline selection unit (e.g., the bitline selection transistors BST) may be disposed between the lower local wordlines structures 210a and 220a and the substrate 100 in a vertical view. Additionally, global bitlines GBL may be disposed on the substrate 100 of the cell array region CAR to cross the first and second lower local wordline structures 210a and 220a. As described with reference to FIGS. 5A and 5B, each of the bitline selection transistors BST may include the gate pattern crossing the global bitlines GBL, at least one vertical channel pillar 117 penetrating the gate pattern 117 to be in contact with the global bitline GBL, and a gate insulating layer 115 between the gate pattern 113 and a sidewall of the vertical channel pillar 117. Additionally, a lower bitline pad pattern 125 may be disposed between the vertical channel pillar 117 and the lower local bitline LBLa.

Alternatively, as described with reference to FIGS. 5B and 6B, a plurality of bitline selection transistors BST may be disposed on the first and second upper local wordline structures 210b and 220b. That is, the gate patterns 113 and the vertical channel pillars 117 may be disposed on the upper planarization insulating layer 160, and global bitlines GBL formed of conductive patterns may be disposed on top surfaces of the vertical channel pillars 117.

The semiconductor memory devices described above may be encapsulated using various packaging techniques. For example, a semiconductor memory devices according to example embodiments of inventive concepts may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique. The package in which a semiconductor memory device according to example embodiments of inventive concepts is mounted may further include at least one semiconductor device (e.g., a controller and/or a logic device) that controls the semiconductor memory device.

Figure 7:
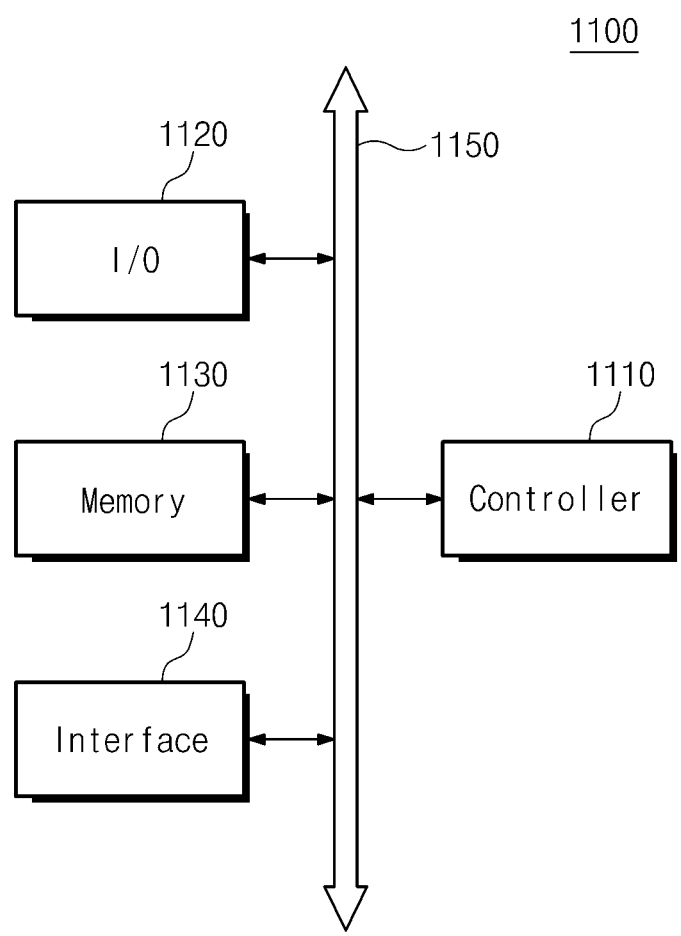
FIG. 7 is a schematic block diagram illustrating an electronic systems including semiconductor memory devices according to example embodiments of inventive concepts.

FIG. 7 is a schematic block diagram illustrating an example of electronic systems including semiconductor memory devices according to example embodiments of inventive concepts.

Referring to FIG. 7, an electronic system 1100 according to an embodiment of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard and/or a display unit. The memory device 1130 may store data and/or commands. The memory device 1130 may include at least one semiconductor memory device according to example embodiments of inventive concepts. The memory device 1130 may further include another type of semiconductor memory devices (e.g., a dynamic random access memory (DRAM) device and/or a static random access memory (SRAM) device) which are different from the semiconductor memory devices according to embodiments of the inventive concept. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 8:
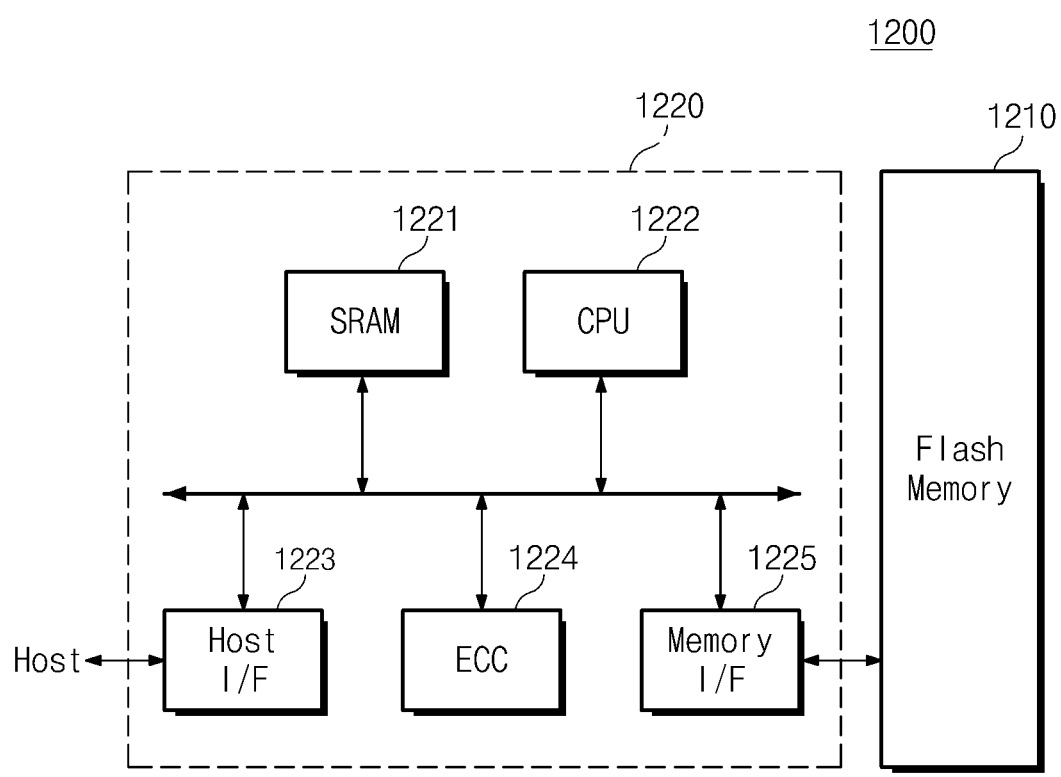
FIG. 8 is a schematic block diagram illustrating a memory cards including semiconductor memory devices according to example embodiments of inventive concepts.

FIG. 8 is a schematic block diagram illustrating an example of memory cards including semiconductor memory devices according to example embodiments of inventive concepts.

Referring to FIG. 8, a memory card 1200 according to an embodiment of the inventive concept may include a memory device 1210. The memory device 1210 may include at least one of the semiconductor memory devices according to the embodiments mentioned above. In other embodiments, the memory device 1210 may further include another type of semiconductor memory devices (e.g., a DRAM device and/or a SRAM device) which are different from the semiconductor devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

According to example embodiments of inventive concepts, the number of conductive lines connected in common to each other may be reduced in conductive lines disposed at the same height from the substrate. It is possible to reduce an occupied area of interconnections respectively connected to the conductive lines stacked on the substrate. Additionally, it is possible to decrease a leakage current through non-selected memory cells in three-dimensionally arranged memory cells. As a result, it is possible to improve integration and reliability of the three-dimensional semiconductor memory device.

While some example embodiments have been particularly shown and described, it will be understood by one of ordinary skill in the art that variations in form and detail may be made therein without departing from the spirit and scope of the claims.

What is claimed is:

1. A semiconductor memory device comprising:
a substrate including a cell array region between a first and a second connection region;
a first stacked structure including,
a plurality of first wordline structures sequentially stacked, each of the first wordline structures including,
a plurality of first wordlines extending in a first direction on the cell array region of the substrate, and
a first connecting pad extending in a second direction that crosses the first direction on the first connection region of the substrate, the first connecting pad being connected in common to at least one of the plurality of the first wordlines; and
an insulating layer covering the first stacked structure;
a plurality of first interconnections disposed on the insulating layer in the first connection region of the substrate, the first interconnections being connected to the first connecting pad of the plurality of first wordline structures, respectively,
wherein a length of the first connecting pad in the first direction is substantially equal to a product of a minimum pitch between the first interconnections and a stack number of one of the plurality of first wordline structures,
the first connecting pad is formed on the same layer as the plurality of first wordlines, in each of the first wordline structures.

2. The semiconductor memory device of claim 1, further comprising:
second stacked structure including,
a plurality of second wordline structures sequentially stacked, each of the second wordline structures including,
a plurality of second wordlines extending in the first direction and disposed between the plurality of the first wordlines in the second direction, and
a second connecting pad extending in the second direction on the second connection region of the substrate,
the second connecting pad being connected in common to at least one of the plurality of -second wordlines; and
second interconnections disposed on the insulating layer in the second connection region,
the second interconnections connected to the second connecting pads of the second wordline structures, respectively,
the second connecting pad is formed on the same layer as the plurality of second wordlines, in each of the first wordline structures.

3. The semiconductor memory device of claim 2, wherein a length of the second connecting pad in the second direction is substantially equal to a product of a minimum pitch between the second interconnections and a stack number of one the plurality of second wordline structure.

4. The semiconductor memory device of claim 2, wherein a number N of the first wordlines connected in common to the first connecting pad satisfies the following mathematical formula:

$$N<L/2(W+S)$$ [Mathematical formula]

where the L is the length of the first connecting pad in the second direction, W is a width of each of the first wordlines, and S is a space between the plurality of first and second wordlines horizontally adjacent to each other.

5. The semiconductor memory device of claim 2, wherein a plane area of the first connecting pad is reduced with increasing distance from the substrate.

6. The semiconductor memory device of claim 2, wherein the first connecting pad is electrically insulated from the plurality of second wordlines, and the second connecting pad is electrically insulated from the plurality of first wordlines.

7. The semiconductor memory device of claim 2, wherein the first connecting pad and the first wordlines have identical materials, thicknesses, and distances from the substrate, and the second connecting pad and the second wordlines have identical materials, thicknesses, and distances from the substrate.

8. The semiconductor memory device of claim 2, further comprising:
bitlines substantially vertical to a top surface of the substrate, and
memory elements between the bitlines and the plurality of the first and the second wordlines, respectively, wherein the plurality of the first and second wordlines include sidewalls, and
the bitlines cross one of the sidewalls of the plurality of the first wordlines and the sidewalls of the plurality of the second wordlines.

9. The semiconductor memory device of claim 8, further comprising:
a bitline selection transistor connecting each of the bitlines to a global bitline, wherein the bitline selection transistor includes,
a gate pattern on the cell array region of substrate, and
at least one vertical channel pillar penetrating the gate pattern,
the at least one vertical channel being insulated from the gate pattern.

10. The semiconductor memory device of claim 8, wherein each of the bitlines is connected to a first end of the vertical channel pillar,
the global bitline crosses the gate pattern, and
the global bitline is connected to a second end of the vertical channel pillar.

11. The semiconductor memory device of claim 8, wherein the insulating layer directly contacts each of the bitlines.

12. The semiconductor memory device of claim 8, wherein the memory elements include one of a phase change material, a transition metal oxide, and a magnetic material.

13. A semiconductor memory device comprising:
a substrate including a cell array region adjacent to a connection region;
a stacked structure including a plurality of wordline structures sequentially stacked, each of the wordline structures including,
a plurality of wordlines extending in a first direction on the cell array region of the substrate of the cell array region,
the plurality of wordlines including sidewalls, and
a connecting pad extending in a second direction crossing the first direction on the connection region of the substrate and being connected in common to the plurality of wordlines;
a plurality of interconnections at a height over the connection region of the substrate,
the plurality of interconnections being connected to the connecting pads of the wordline structures, respectively;
bitlines substantially vertical to a top surface of the substrate and crossing one of the sidewalls of the plurality of wordlines; and
memory elements between the bitlines and the plurality of wordlines, respectively,
wherein a length of the connecting pad in the second direction is substantially equal to the product of a minimum pitch between the interconnections and a stack number of one the plurality of wordlines,
the connecting pad is formed on the same layer as the plurality of wordlines, in each of the wordline structures.

14. The semiconductor memory device of claim 13, further comprising:
a bitline selection transistor connecting each of the bitlines to a global bitline, wherein the bitline selection transistor includes,
a gate pattern on the cell array region of the substrate, and
at least one vertical channel pillar penetrating the gate pattern,
the at least one vertical channel pillar being insulated from the gate pattern.

15. The semiconductor memory device of claim 13, further comprising:
an insulating layer covering the stacked structure and the interconnections; and
an upper stacked structure on the stacked structure with the insulating layer therebetween, wherein
the upper stacked structure includes a plurality of upper wordline structures sequentially stacked; and
each of the upper wordline structures includes,
a plurality of upper wordlines extending in the first direction on the substrate of the cell array region, and
a connecting pad extending in the second direction on the substrate of the connection region and being connected in common to the plurality of upper wordlines.

16. A semiconductor memory device comprising:
a first plurality of local bitlines extending vertically over a cell array region of the substrate;
a plurality of first interconnection lines spaced apart by a first pitch and extending in a first direction on a first connection region of the substrate;
a first local wordline structure including a plurality of first wordlines spaced apart vertically and extending in the first direction over the cell array region of the substrate,
the plurality of first wordlines including first pad portions that are connected to the plurality of first interconnection lines and extend in a second direction over the first connection region of the substrate,
the second direction intersecting the first direction, and
a length of one of the first pad portions extending in the second direction equals a product of the first pitch of the plurality of the first interconnection lines and a stack number of the one of the first pad portions of the plurality of first wordlines,
wherein the first and the second directions are substantially parallel with respect to an upper surface of the substrate.

17. The semiconductor memory device of claim 16, further comprising:
a first resistive memory pattern between the first plurality of local bitlines and the plurality of first local wordlines of the first local wordline structure.

18. The semiconductor memory device of claim 16, further comprising:
a second plurality of local bitlines extending vertically over the cell array region of the substrate;
a plurality of second interconnection lines spaced apart by a second pitch and extending in a first direction on a second connection region of the substrate;
a second local wordline structure including a plurality of second wordlines spaced apart vertically and extending in the first direction over the cell array region of the substrate,
the plurality of second wordlines including second pad portions that are connected to the plurality of second interconnection lines and extend in a second direction over the second connection region of the substrate, and
a length of one of the second pad portions extending in the second direction equals a product of the second pitch of the plurality of the second interconnection lines and a stack number of the one of the second pad portions of the plurality of second wordlines.

19. The semiconductor memory device of claim 18, further comprising:
local bitline selection unit connecting the first plurality of local bitlines to a plurality of global bitlines.

20. The semiconductor memory device of claim 16, wherein a plane area of the first pad portion of each of the first wordlines is reduced with increasing distance from the substrate.

* * * * *